United States Patent
Zhang et al.

(10) Patent No.: US 12,126,141 B2
(45) Date of Patent: Oct. 22, 2024

(54) METHOD OF PRODUCING ULTRAVIOLET LASER DIODE, AND ULTRAVIOLET LASER DIODE

(71) Applicants: ASAHI KASEI KABUSHIKI KAISHA, Tokyo (JP); National University Corporation Tokai National Higher Education and Research System, Nagoya (JP)

(72) Inventors: Ziyi Zhang, Tokyo (JP); Maki Kushimoto, Nagoya (JP); Chiaki Sasaoka, Nagoya (JP); Hiroshi Amano, Nagoya (JP)

(73) Assignees: ASAHI KASEI KABUSHIKI KAISHA, Tokyo (JP); National University Corporation Tokai National Higher Education and Research System, Nagoya (JP)

( * ) Notice: Subject to any disclaimer, the term of this patent is extended or adjusted under 35 U.S.C. 154(b) by 200 days.

(21) Appl. No.: 17/229,875

(22) Filed: Apr. 14, 2021

(65) Prior Publication Data

US 2021/0320477 A1 Oct. 14, 2021

(30) Foreign Application Priority Data

Apr. 14, 2020 (JP) ................. 2020-072539

(51) Int. Cl.
*H01S 5/323* (2006.01)
*H01S 5/02* (2006.01)
(Continued)

(52) U.S. Cl.
CPC ........ *H01S 5/32308* (2013.01); *H01S 5/0206* (2013.01); *H01S 5/04256* (2019.08); *H01S 5/2275* (2013.01); *H01S 5/3215* (2013.01)

(58) Field of Classification Search
CPC .... H01S 5/04256; H01S 5/32308; H01S 5/22; H01S 5/2275; H01S 5/227
See application file for complete search history.

(56) References Cited

U.S. PATENT DOCUMENTS 9,680,057 B2 * 6/2017 Moe .................. H01L 33/32
2007/0195851 A1 * 8/2007 Chae ................. H01S 5/34333
372/87
(Continued)

FOREIGN PATENT DOCUMENTS

JP 2018532265 A 11/2018

OTHER PUBLICATIONS

Kosuke Sato et al., Room-temperature operation of AlGaN ultraviolet-B laser diode at 298 nm on lattice-relaxed Al0.6 Ga0.4 N/AlN/sapphire, Applied Physics Express, Feb. 28, 2020, vol. 13, No. 3, The Japan Society of Applied Physics.
(Continued)

*Primary Examiner* — Minsun O Harvey
*Assistant Examiner* — Stephen Sutton Kotter
(74) *Attorney, Agent, or Firm* — KENJA IP LAW PC

(57) ABSTRACT

A method of producing an ultraviolet laser diode with a low oscillation threshold current density includes stacking a first cladding layer, a light-emitting layer, and a second cladding layer on a substrate in this order to form a nitride semiconductor laminate (step S101), etching at least a portion of the nitride semiconductor laminate to form a mesa structure and setting the ratio between the length of the resonator end faces and the length of the side surfaces of the mesa structure in plan view between 1:5 and 1:500 (step S102), disposing first conductive material on a portion of a first area and applying heat treatment of 400° C. or higher to form a first electrode (step S103), and disposing a second conductive material in an area on the second cladding layer, at a distance (Continued)

of 5 μm or more from the side surfaces, to form a second electrode (step S104).

9 Claims, 16 Drawing Sheets

(51) Int. Cl.
*H01S 5/042* (2006.01)
*H01S 5/227* (2006.01)
*H01S 5/32* (2006.01)

(56) References Cited

U.S. PATENT DOCUMENTS

| 2009/0067464 | A1* | 3/2009 | Tanaka | B82Y 20/00 |
| | | | | 372/45.011 |
| 2017/0084779 | A1 | 3/2017 | Moe et al. | |
| 2021/0194206 | A1* | 6/2021 | Raring | H04B 10/40 |

OTHER PUBLICATIONS

Ziyi Zhang et al., A 271.8 nm deep-ultraviolet laser diode for room temperature operation, Applied Physics Express, Nov. 7, 2019, vol. 12, No. 12, The Japan Society of Applied Physics.

* cited by examiner

METHOD OF PRODUCING ULTRAVIOLET LASER DIODE, AND ULTRAVIOLET LASER DIODE

TECHNICAL FIELD

The present disclosure relates to a method of producing an ultraviolet laser diode, and an ultraviolet laser diode.

BACKGROUND

Nitride semiconductors have a direct transition form of recombination, enabling a high recombining efficiency and high optical gain to be obtained. Nitride semiconductors are thus suitable as a material for laser diodes. For example, PTL 1 discloses a technique for using a composition gradient layer to improve the carrier injection efficiency.

CITATION LIST

Patent Literature

PTL 1: JP 2018-532265 A

SUMMARY

The above-described technique assumes the use of an ultraviolet light emitting diode (LED). Nearly no consideration has been given to an ultraviolet laser diode. In particular, nothing is known about the arrangement of electrodes in an ultraviolet laser diode.

To reduce element resistance and make the ultraviolet laser diode oscillate at a low threshold current density, a configuration in which a second electrode 6A, 6B is disposed as close as possible to the side surface by the side of a first electrode 5A, 5B of a mesa structure 300A, 300B, as illustrated in FIGS. 6A and 6B, could be considered appropriate on the basis of common technical knowledge about visible light laser diodes.

Adopting such a structure in an ultraviolet laser diode, however, does not in fact yield the desired low oscillation threshold current density.

It would be helpful to provide a method of producing an ultraviolet laser diode, and an ultraviolet laser diode, with a low oscillation threshold current density.

A method of producing an ultraviolet laser diode according to an embodiment includes stacking a first cladding layer that includes a first area of a first conductive nitride semiconductor layer and a second area of the first conductive nitride semiconductor layer, a light-emitting layer that includes one or more quantum well layers, and a second cladding layer that includes a second conductive nitride semiconductor layer, on a substrate in this order to form a nitride semiconductor laminate, etching at least a portion of the nitride semiconductor laminate to form a mesa structure that includes the second area, the light-emitting layer, and the second cladding layer, and setting a ratio between a length of resonator end faces and a length of side surfaces of the mesa structure in plan view to 1:5 or more and 1:500 or less, disposing first conductive material on a portion of the first area and applying heat treatment of 400° C. or higher to form a first electrode, and disposing a second conductive material in an area that is on the second cladding layer and is at a distance of 5 μm or more from the side surfaces to form a second electrode.

An ultraviolet laser diode according to an embodiment includes a first cladding layer that includes a first area of a first conductive nitride semiconductor layer and a second area of the first conductive nitride semiconductor layer, a light-emitting layer that includes one or more quantum well layers, and a second cladding layer that includes a second conductive nitride semiconductor layer on a substrate in this order, and a second electrode. In a mesa structure that includes the second area, the light-emitting layer, and the second cladding layer, a ratio between a length of resonator end faces and a length of side surfaces of the mesa structure in plan view is 1:5 or more and 1:500 or less, and the second electrode is provided in an area that is on the second cladding layer and is at a distance of 5 μm or more from the side surfaces.

An ultraviolet laser diode according to an embodiment includes a first cladding layer that includes a first area of a first conductive nitride semiconductor layer and a second area of the first conductive nitride semiconductor layer, a light-emitting layer that includes one or more quantum well layers, and a second cladding layer that includes a second conductive nitride semiconductor layer on a substrate in this order, and a second electrode. In a mesa structure that includes the second area, the light-emitting layer, and the second cladding layer, a ratio between a length of resonator end faces and a length of side surfaces of the mesa structure in plan view is 1:5 or more and 1:500 or less, and the second electrode is provided in an area that is on the second cladding layer and is at a distance of 5 μm or more from the resonator end faces and the side surfaces.

The above overview of the present disclosure does not list all of the features of the present disclosure. Furthermore, sub-combinations of these groups of features may be made.

The present disclosure can provide a method of producing an ultraviolet laser diode, and an ultraviolet laser diode, with a low oscillation threshold current density.

DETAILED DESCRIPTION

Figure 1:
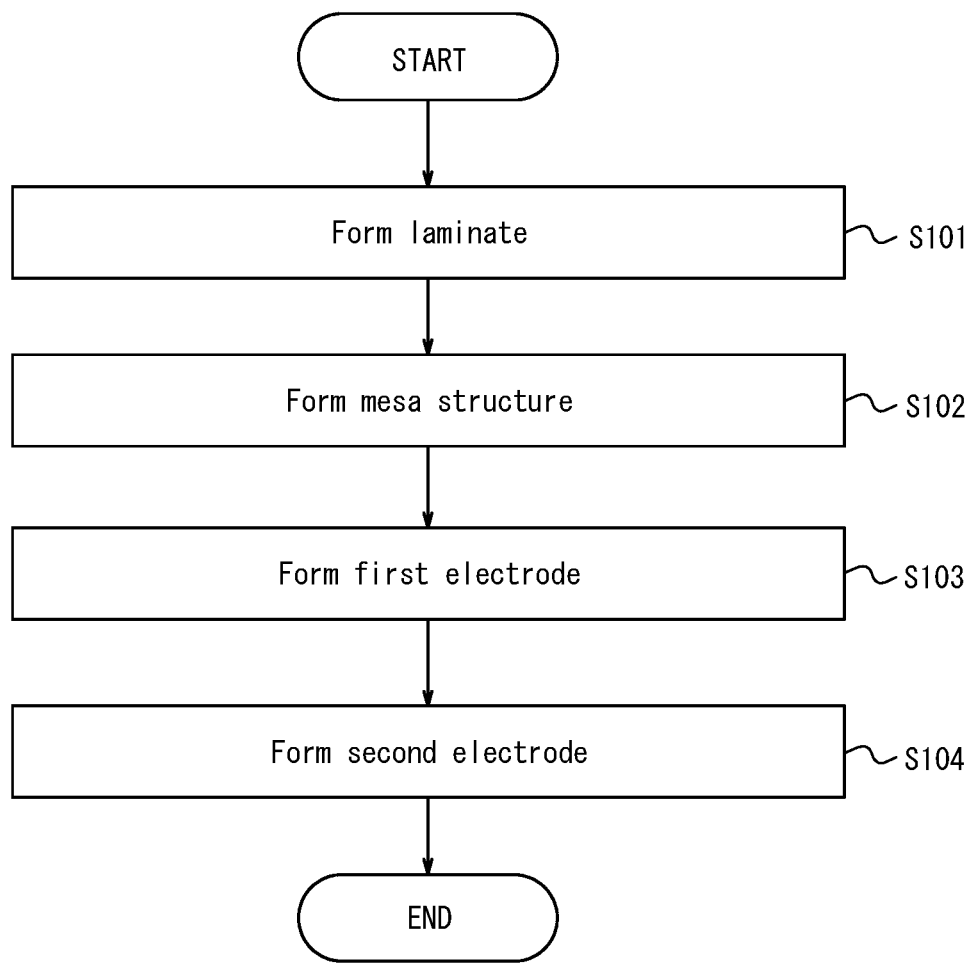
FIG. 1 is a flowchart illustrating an example of a method of producing an ultraviolet laser diode according to a first embodiment.

Embodiments of the present disclosure are described below in detail with reference to the drawings. As a general rule, the same constituent elements are labeled with the same reference signs, and redundant explanation is omitted. The vertical/horizontal ratio of each configuration illustrated in the drawings is exaggerated from the actual ratio for the sake of explanation.

Furthermore, for the sake of explanation, "above" is assumed to refer to the second electrode side depicted in the drawings, and "below" is assumed to refer to the substrate side depicted in the drawings. However, "above" and "below" are only defined for convenience and are not to be interpreted as limiting.

The "mesa structure" refers to a structure that, taking a certain surface as a reference, is arranged continuously with the surface and at a higher position. Accordingly, the "mesa structure" in the present disclosure refers to a structure that, taking the upper surface of a first area as a reference, includes a second area, a light emitting layer, and a second cladding layer, which are arranged continuously with the upper surface and at a higher position.

The "side surfaces of the mesa structure" in the present disclosure refer to the faces other than the resonator end faces in the mesa structure. Between the two faces other than the resonator end faces in the mesa structure, "one side surface of the mesa structure" refers to the face on the side where the first electrode is formed, and between the two faces other than the resonator end faces in the mesa structure, the "other side surface of the mesa structure" refers to the face on the side where the first electrode is not formed.

First Embodiment

<Method of Producing Ultraviolet Laser Diode>

An example method of producing an ultraviolet laser diode 100 according to the first embodiment is described with reference to FIG. 1 and FIGS. 2A through 2E.

The method of producing the ultraviolet laser diode 100 includes stacking a first cladding layer 20 that includes a first area 21 of a first conductive nitride semiconductor layer and a second area 22 of the first conductive nitride semiconductor layer, a light-emitting layer 30 that includes one or more quantum well layers, and a second cladding layer 40 that includes a second conductive nitride semiconductor layer, on a substrate 10 in this order to form a nitride semiconductor laminate 200 (step S101), etching at least a portion of the nitride semiconductor laminate 200 to form a mesa structure 300 that includes the second area 22, the light-emitting layer 30, and the second cladding layer 40, and setting the ratio between a length W1 of a resonator end face 301 and a length W2 of a side surface 302 of the mesa structure 300 in plan view to 1:5 or more and 1:500 or less (step S102), disposing first conductive material on a portion of the first area and applying heat treatment of 400° C. or higher to form a first electrode (step S103), and disposing a second conductive material in an area that is on the second cladding layer 40 and is at a distance of 5 μm or more from the side surface 302 of the mesa structure 300 to form a second electrode (step S104).

Details of each process are sequentially described below.

[Formation Process of Nitride Semiconductor Laminate: Step S101]

Figure 2A:
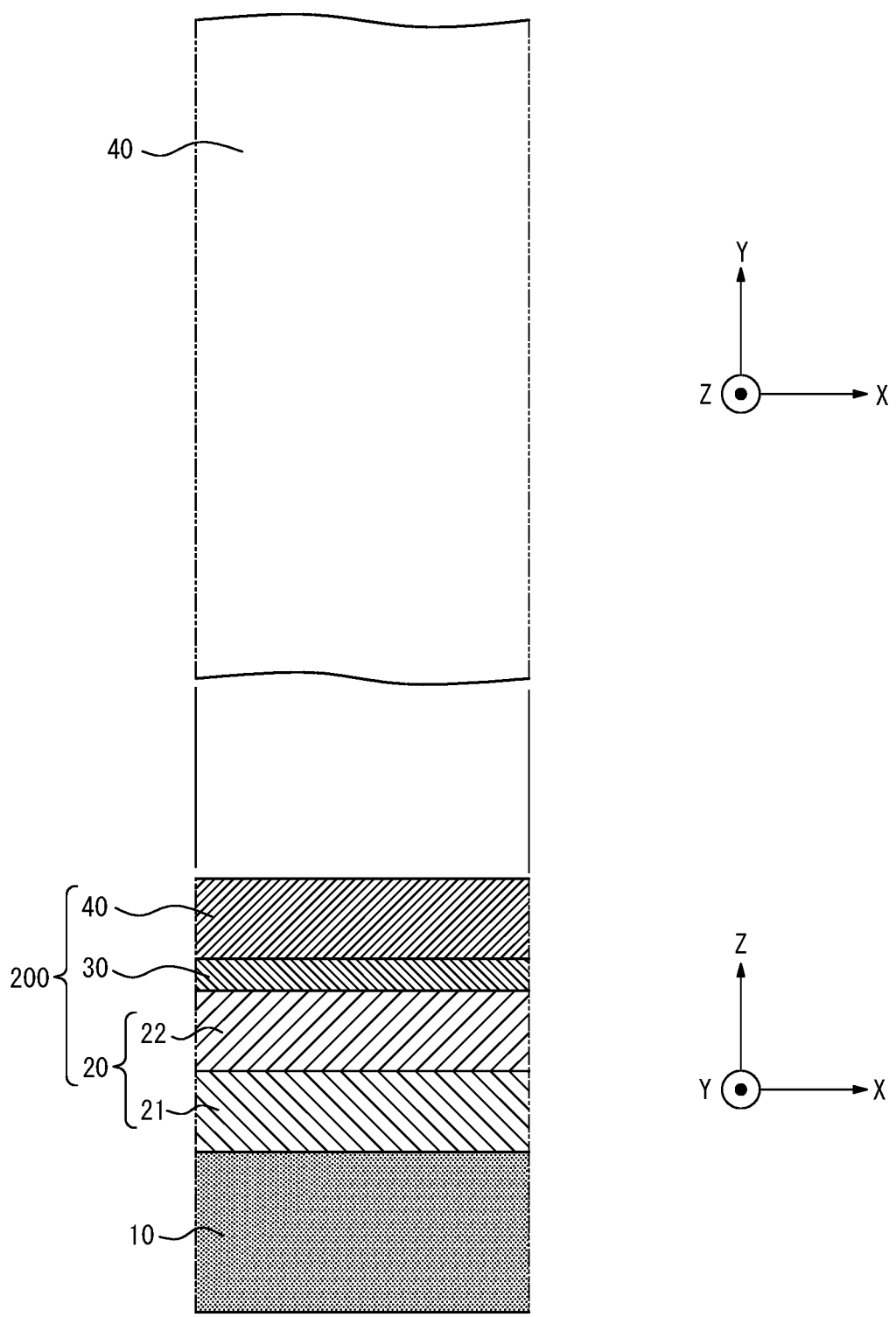
FIG. 2A is a diagram illustrating an example of the method of producing an ultraviolet laser diode according to the first embodiment.

First, as illustrated in FIG. 2A, the first cladding layer 20, the light-emitting layer 30, and the second cladding layer 40 are stacked in this order on the substrate 10 to form the nitride semiconductor laminate 200. The first cladding layer 20 includes the first area 21 of the first conductive nitride semiconductor layer and the second area 22 of the first conductive nitride semiconductor layer. The light-emitting layer 30 includes one or more quantum well layers. The second cladding layer 40 includes the second conductive nitride semiconductor layer.

The thickness of the nitride semiconductor laminate 200 is preferably approximately 2 μm or less, more preferably approximately 1.5 μm or less.

The first cladding layer 20, the light-emitting layer 30, and the second cladding layer 40 are preferably formed by a nitride semiconductor. For example, AlGaN, GaN, InGaN, BN, BAlN, BAlGaN, InAlGaN, and the like are preferred.

The first cladding layer 20 is preferably formed by a first conductive nitride semiconductor. The second cladding layer 40 is preferably formed by a second conductive nitride semiconductor. First conductive and second conductive refer to how one has n-type conductivity and the other p-type conductivity. For example, first conductive may refer to having n-type conductivity. For example, second conductive may refer to having p-type conductivity.

The emission wavelength of the light-emitting layer 30 is not particularly limited but is preferably 210 nm or more and 360 nm or less.

The thickness and structure of each layer in the nitride semiconductor laminate 200 may conform to thicknesses and structures widely known in the present technical field. The nitride semiconductor laminate 200 may be formed on the substrate 10.

[Formation Process of Mesa Structure: Step S102]

Figure 2B:
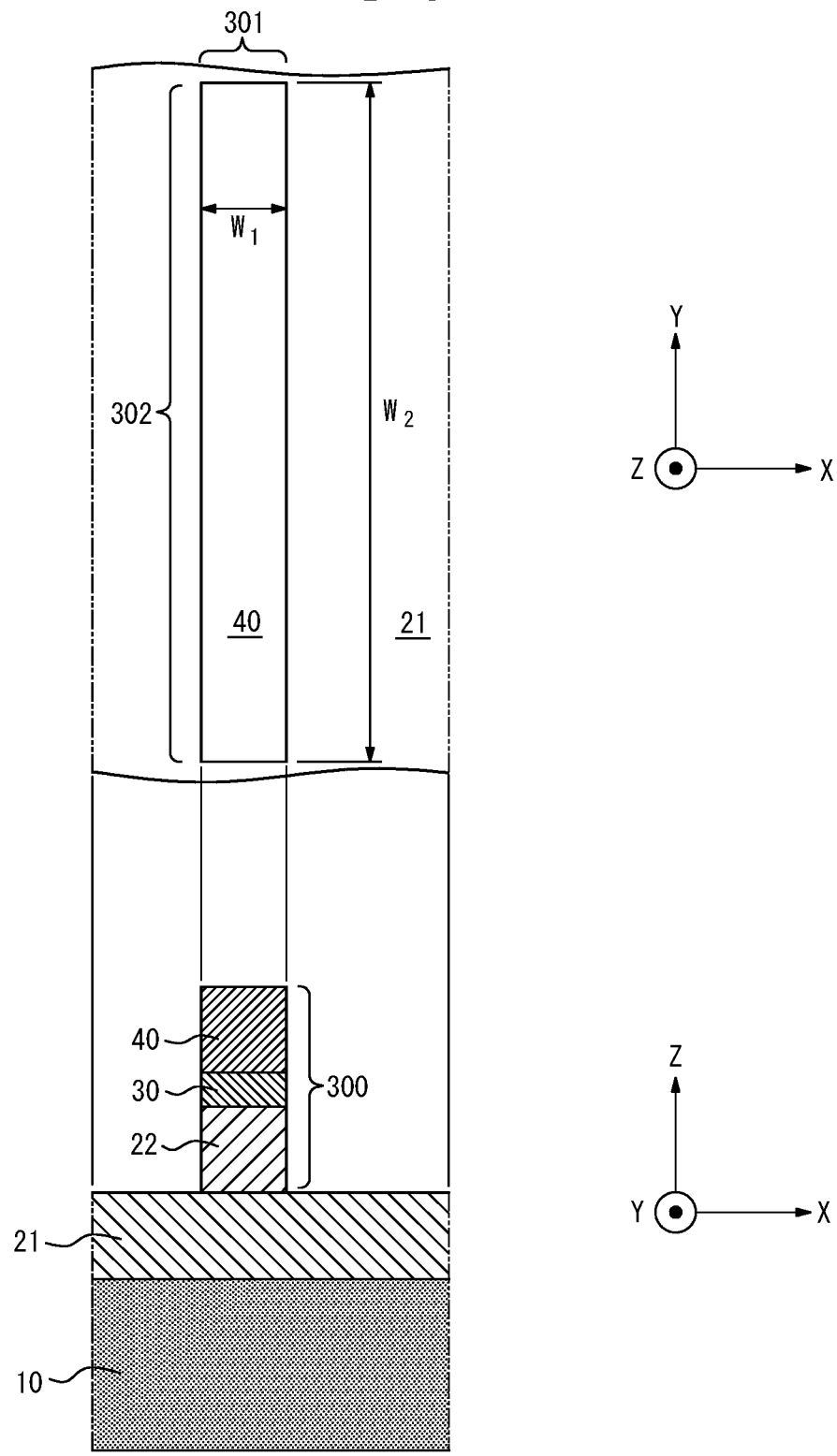
FIG. 2B is a diagram illustrating an example of the method of producing an ultraviolet laser diode according to the first embodiment.

Next, as illustrated in FIG. 2B, etching is performed on at least a portion of the nitride semiconductor laminate 200 to form the mesa structure 300 that includes the second area 22, the light-emitting layer 30, and the second cladding layer 40.

In the mesa structure 300, the length W1 of the resonator end faces 301 in plan view is preferably shorter than the length W2 of the side surfaces 302 of the mesa structure 300 in plan view. In the mesa structure 300, the ratio between the length W1 of the resonator end faces 301 and the length W2 of the side surfaces 302 of the mesa structure 300 in plan view is preferably 1:5 or more and 1:500 or less. For example, in FIG. 2B, the ratio between the length W1 of the resonator end faces 301 and the length W2 of the side surfaces 302 of the mesa structure 300 in plan view is 1:8. Setting the ratio between the length W1 of the resonator end faces 301 and the length W2 of the side surfaces 302 of the mesa structure 300 in plan view within this range enables efficient current injection over a wide area in the resonance direction in the ultraviolet laser diode 100. Furthermore, a current constriction effect can reduce the drive current for reaching the oscillation threshold current density, thereby reducing the heat produced by resistance and endowing the ultraviolet laser diode 100 with longer element life.

The resonator end faces 301 may be formed by etching or by another process. The side surfaces 302 of the mesa structure 300 are preferably formed by etching. By at least the side surfaces 302 being formed by etching in the mesa structure 300, the oscillation threshold current density of the ultraviolet laser diode 100 can be reduced as compared to a conventional ultraviolet laser diode.

Any appropriate etching process may be used. Examples include dry etching processes such as reactive ion etching based on chlorine gas, focused ion beam etching, and neutron particle beam etching, and milling. Examples also include wet etching processes for immersion in a solution that is erosive with respect to the substrate 10 and the nitride semiconductor laminate 200, such as an alkaline solution. Further examples include combinations of the aforementioned dry etching, milling, and wet etching.

[Formation Process of First Electrode: Step S103]

Figure 2C:
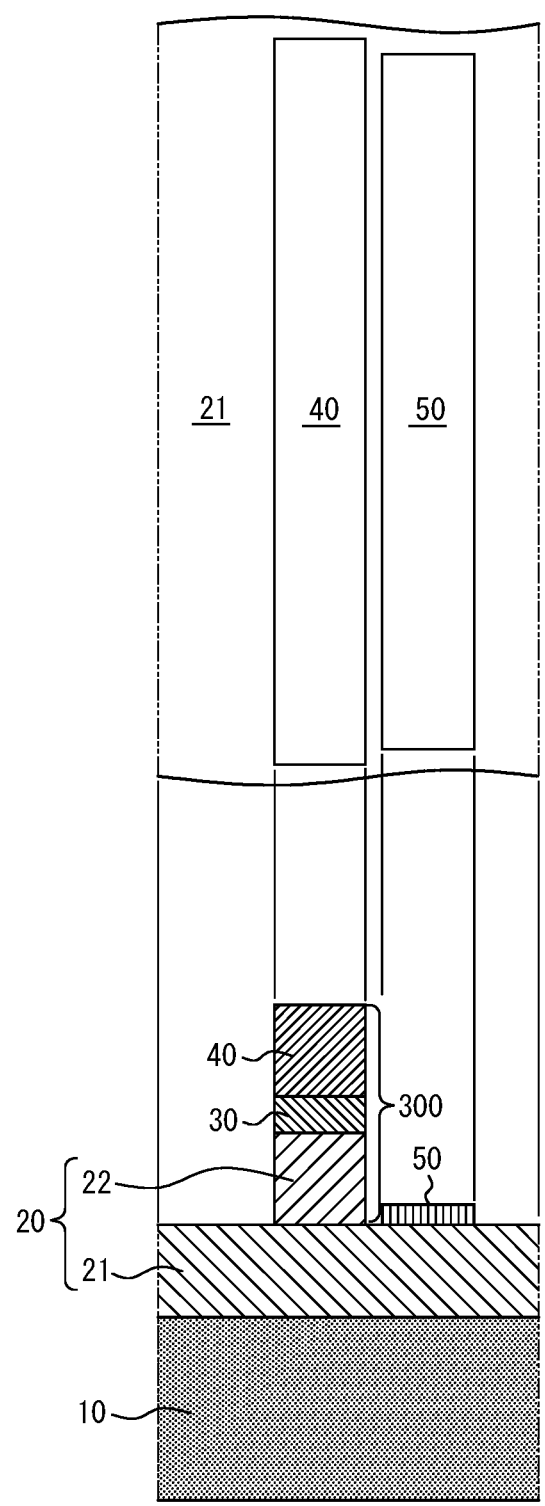
FIG. 2C is a diagram illustrating an example of the method of producing an ultraviolet laser diode according to the first embodiment.

Next, as illustrated in FIG. 2C, the first conductive material is disposed on a portion of the first area 21, and heat treatment of 400° C. or higher is applied to form a first electrode 50. By the temperature of the heat treatment being set to at least 400° C., the first electrode 50 can be alloyed, and the contact resistance can be reduced. A plurality of additional first electrodes 50 may be disposed at positions other than those illustrated in FIG. 2D. For example, first electrodes 50 may be disposed on the left and right of the mesa structure 300 in plan view.

The thickness of the first electrode 50 is preferably 10 nm or more and 400 nm or less and is more preferably 50 nm or more.

The method for disposing the first conductive material on a portion of the first area 21 is not particularly limited. Patterning and liftoff may be performed by photolithography so that the first conductive material is only disposed in a predetermined area, for example. After forming a conductive film made of the first conductive material on the first area 21, patterning may be performed in a predetermined area, and subsequently, the conductive film may be etched or milled.

Examples of the heat treatment include a rapid thermal process in a nitrogen atmosphere. The temperature of the heat treatment is preferably 400° C. or more and 950° C. or less, more preferably 800° C. or more and 900° C. or less. The duration of the heat treatment is preferably 30 seconds or longer and 20 minutes or less, more preferably 1 minute or longer and 5 minutes or less. The first electrode 50 can suitably be alloyed when the temperature and duration of the heat treatment are within the aforementioned ranges. The temperature of the heat treatment refers to the environmental temperature.

[Formation Process of Second Electrode: Step S104]

Figure 2D:
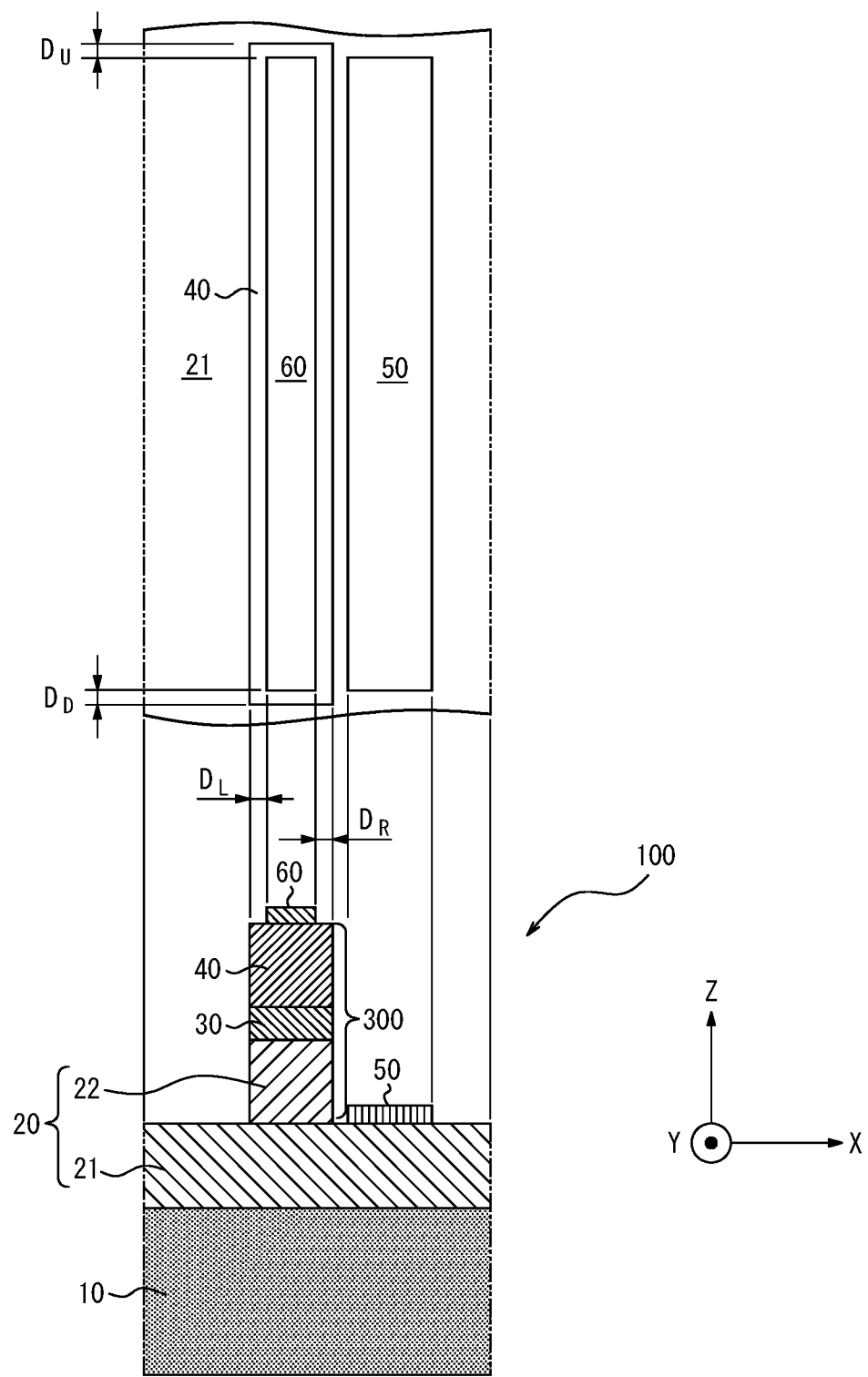
FIG. 2D is a diagram illustrating an example of the method of producing an ultraviolet laser diode according to the first embodiment.
Figure 2E:
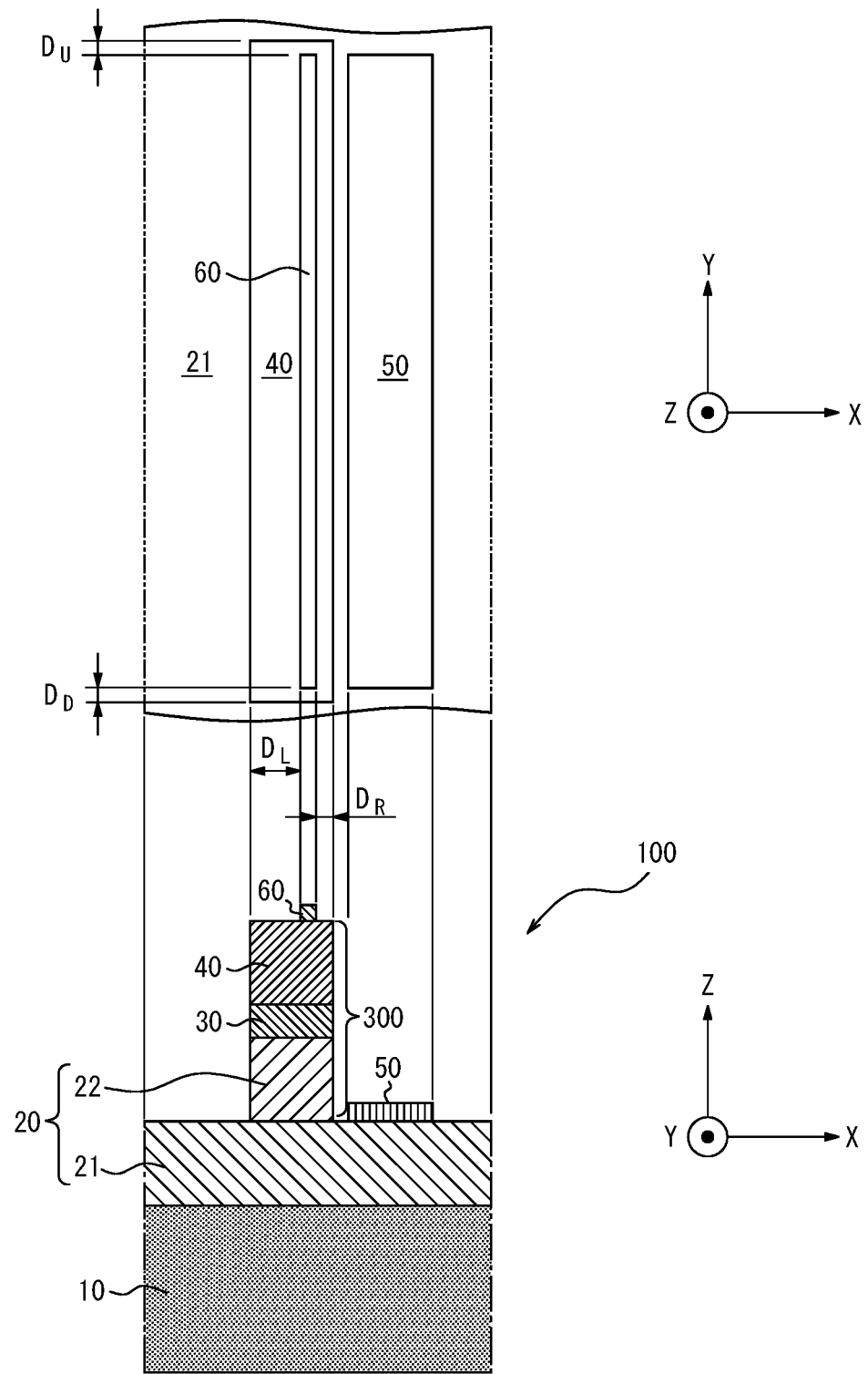
FIG. 2E is a diagram illustrating an example of the method of producing an ultraviolet laser diode according to the first embodiment.

Next, as illustrated in FIGS. 2D and 2E, the second conductive material is disposed in an area that is on the second cladding layer 40 and is such that a distance $D_U$, $D_D$ from the resonator end faces 301 is 5 μm or more, and a distance $D_R$, $D_L$ from the side surfaces 302 of the mesa structure 300 is 5 μm or more. The second electrode 60 is thereby formed.

The thickness of the second electrode 60 is preferably 1 nm or more and 200 nm or less, more preferably 10 nm or more and 100 nm or less.

The second conductive material may be disposed in the entire area that is on the second cladding layer 40 and is such that the distance $D_U$, $D_D$ from the resonator end faces 301 is 5 μm or more, and the distance $D_R$, $D_L$ from the side surfaces 302 of the mesa structure 300 is 5 μm or more, as illustrated in FIG. 2D. For example, the second conductive material may be disposed in the entire area that is on the second cladding layer 40 and is such that the distance $D_U$, $D_D$ from the resonator end faces 301 is 5 μm, and the distance $D_R$, $D_L$ from the side surfaces 302 of the mesa structure 300 is 5 μm.

As illustrated in FIG. 2E, the second conductive material may be disposed in a partial area that is on the second cladding layer 40 and is such that the distance $D_U$, $D_D$ from the resonator end faces 301 is 5 μm or more, and the distance $D_R$, $D_L$ from the side surfaces 302 of the mesa structure 300 is 5 μm or more. For example, the second conductive material may be disposed in an area that is on the second cladding layer 40 and is such that the distance $D_U$, $D_D$ from the resonator end faces 301 is 5 μm, the distance $D_R$ from one side surface 302 of the mesa structure 300 is 5 μm, and the distance $D_L$ from the other side surface 302 of the mesa structure 300 is 15 μm.

Furthermore, the second conductive material may be disposed as dots or stripes in an area that is on the second cladding layer 40 and is such that the distance $D_U$, $D_D$ from the resonator end faces 301 is 5 μm or more, and the distance $D_R$, $D_L$ from the side surfaces 302 of the mesa structure 300 is 5 μm or more.

By the second conductive material being disposed in an area such that the distance $D_R$, $D_L$ from the side surfaces 302 of the mesa structure 300 is 5 μm or more and not being disposed in an area such that the distance $D_R$, $D_L$ from the side surfaces 302 of the mesa structure 300 is less than 5 μm, the oscillation threshold current density of the ultraviolet laser diode 100 can be reduced as compared to a conventional ultraviolet laser diode.

In particular, by the second conductive material being disposed in an area such that the distance $D_R$, $D_L$ from the side surfaces 302 of the mesa structure 300 is 15 μm or more and not being disposed in an area such that the distance $D_R$, $D_L$ from the side surfaces 302 of the mesa structure 300 is less than 15 μm, the effect of reducing the oscillation threshold current density of the ultraviolet laser diode 100 as compared to a conventional ultraviolet laser diode can be stably achieved.

The method for disposing the second conductive material in an area on the second cladding layer 40 is not particularly limited. Patterning and liftoff may be performed by photolithography so that the second conductive material is only disposed in a predetermined area, for example. After forming a conductive film made of the second conductive material on the second cladding layer 40, patterning may be performed in a predetermined area, and subsequently, the conductive film may be etched. Stating that the second conductive material is disposed on the second cladding layer 40 does not necessarily mean that the second conductive material is disposed directly on the upper surface of the second cladding layer 40 but rather includes the case of the second conductive material being disposed on the second cladding layer 40 with a contact layer formed from p-GaN or the like therebetween.

Figure 6A:
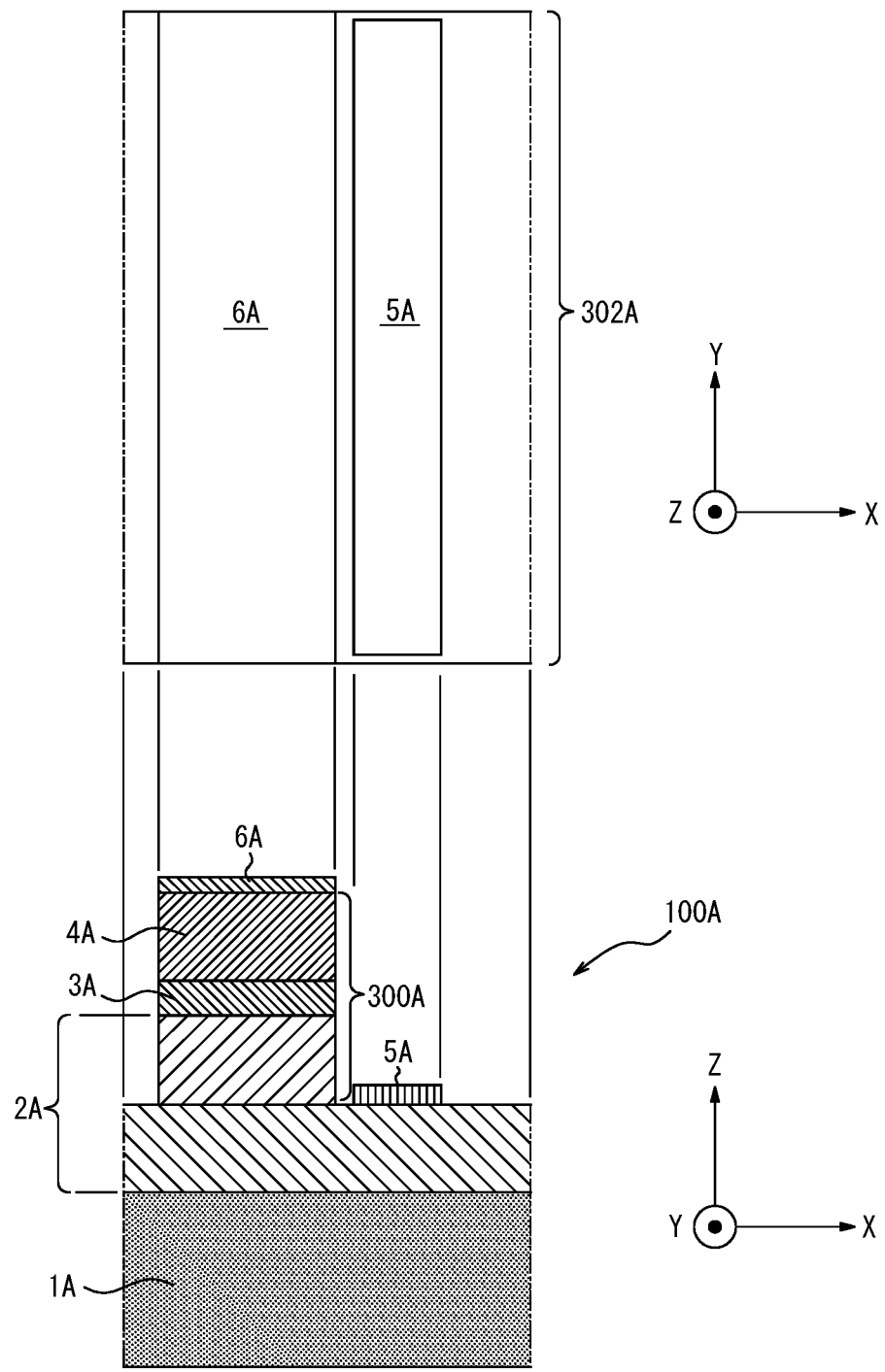
FIG. 6A is a diagram illustrating an example of the configuration of a conventional ultraviolet laser diode.
Figure 6B:
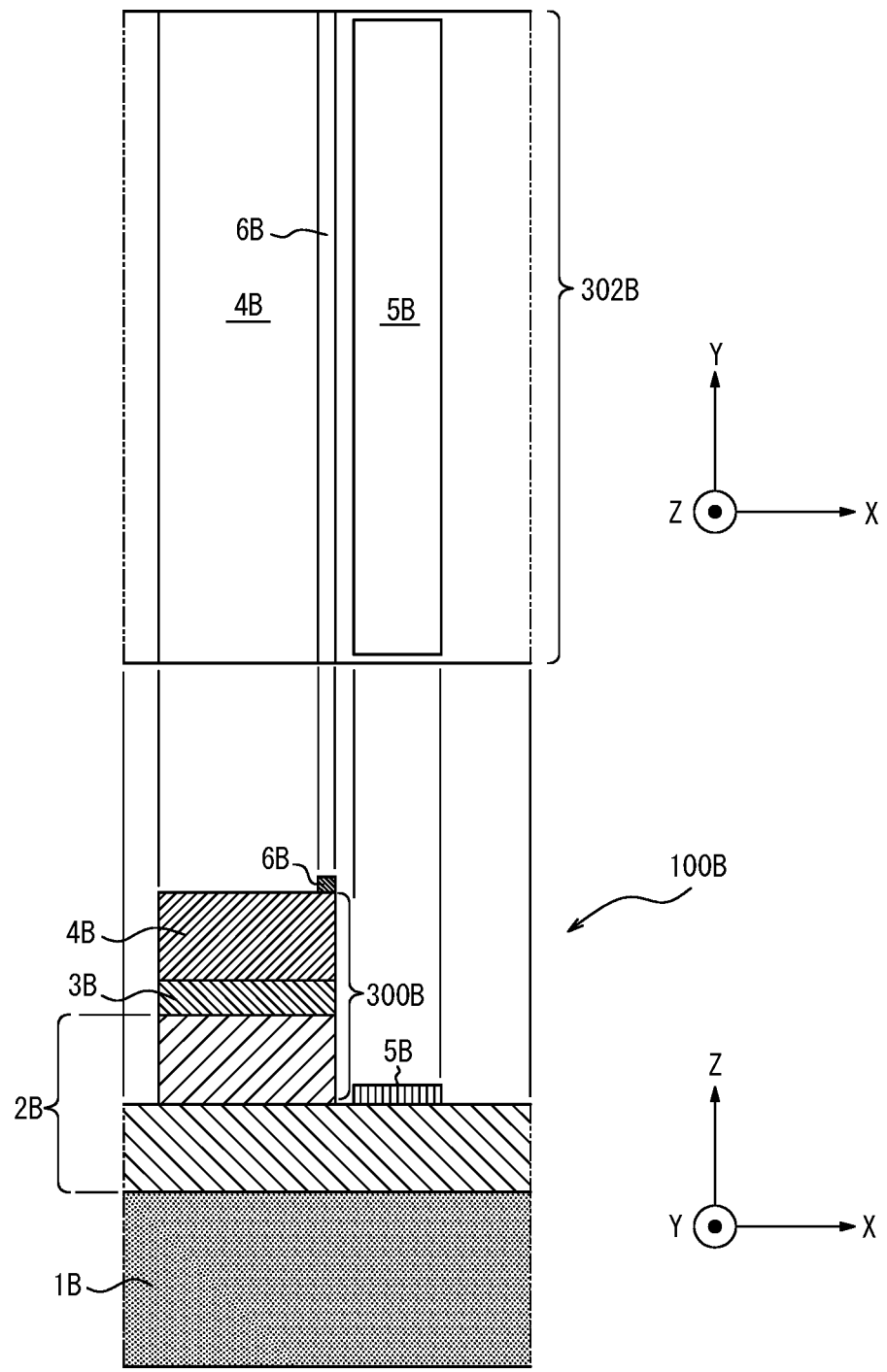
FIG. 6B is a diagram illustrating an example of the configuration of a conventional ultraviolet laser diode.

Here, the ultraviolet laser diode 100 according to the present embodiment as illustrated in FIGS. 2D and 2E is compared with the conventional ultraviolet laser diodes 100A, 100B illustrated in FIGS. 6A and 6B. In the ultraviolet laser diode 100, the second electrode 60 is disposed in an area that is on the second cladding layer 40 and is such that the distance $D_R$, $D_L$ from the side surfaces 302 of the mesa structure 300 is 5 μm or more. On the other hand, in the ultraviolet laser diode 100A, the second electrode 6A is disposed in the entire area on a second cladding layer 4A. Such an electrode arrangement structure could be considered preferable in that power can be provided evenly to the entire nitride semiconductor laminate. In the ultraviolet laser diode 100B, the second electrode 6B is disposed in an area that is on a second cladding layer 4B and is at a distance of less than 5 μm from a side surface 302B of the mesa structure. Such an electrode arrangement structure could be considered preferable in that the first electrode 5B and the second electrode 6B are brought as close together as possible.

While detailed measurement results (see the examples) are described below, the ultraviolet laser diode 100 that has the electrode arrangement structure illustrated in FIGS. 2D and 2E achieves a lower oscillation threshold current density than the ultraviolet laser diodes 100A, 100B that have the electrode arrangement structure illustrated in FIGS. 6A and 6B.

Although the reason is unclear, the light-emitting layer in the ultraviolet laser diode has poor crystallinity in the area such that the distance from the side surfaces of the mesa structure is approximately 5 μm. It is therefore inferred that the current that flows in the area of the light-emitting layer 3A, 3B where the crystallinity is poor in the ultraviolet laser diode 100A, 100B substantially becomes internal loss, and the oscillation threshold current density ends up increasing.

It could also be that, in the ultraviolet laser diode, a plurality of layers that include the light-emitting layer in the area such that the distance from the side surfaces of the mesa structure is approximately 5 μm are damaged by etching at the side surfaces of the mesa structure, worsening the crystallinity. It is therefore inferred that the power supplied to the area with worsened crystallinity in the ultraviolet laser diode 100A, 100B substantially becomes internal loss, and the oscillation threshold current density ends up increasing.

The surface area of the second electrode in plan view is smaller in the ultraviolet laser diode 100 than in the ultraviolet laser diode 100A, but is larger in the ultraviolet laser diode 100 than in the ultraviolet laser diode 100B. Accordingly, the oscillation threshold current density of the ultraviolet laser diode is inferred not to be directly related to the area of the second electrode.

The ultraviolet laser diode 100 according to the present embodiment can be produced by performing all, or an appropriately selected portion, of the aforementioned processes. In the ultraviolet laser diode 100 according to the present embodiment, the second electrode 60 is disposed in an area that is on the second cladding layer 40 and is such that the distance $D_R$, $D_L$ from the side surfaces 302 of the mesa structure 300 is 5 μm or more. The oscillation threshold current density can thereby be reduced as compared to the conventional ultraviolet laser diodes 100A, 100B.

<Ultraviolet Laser Diode>

Figure 3A:
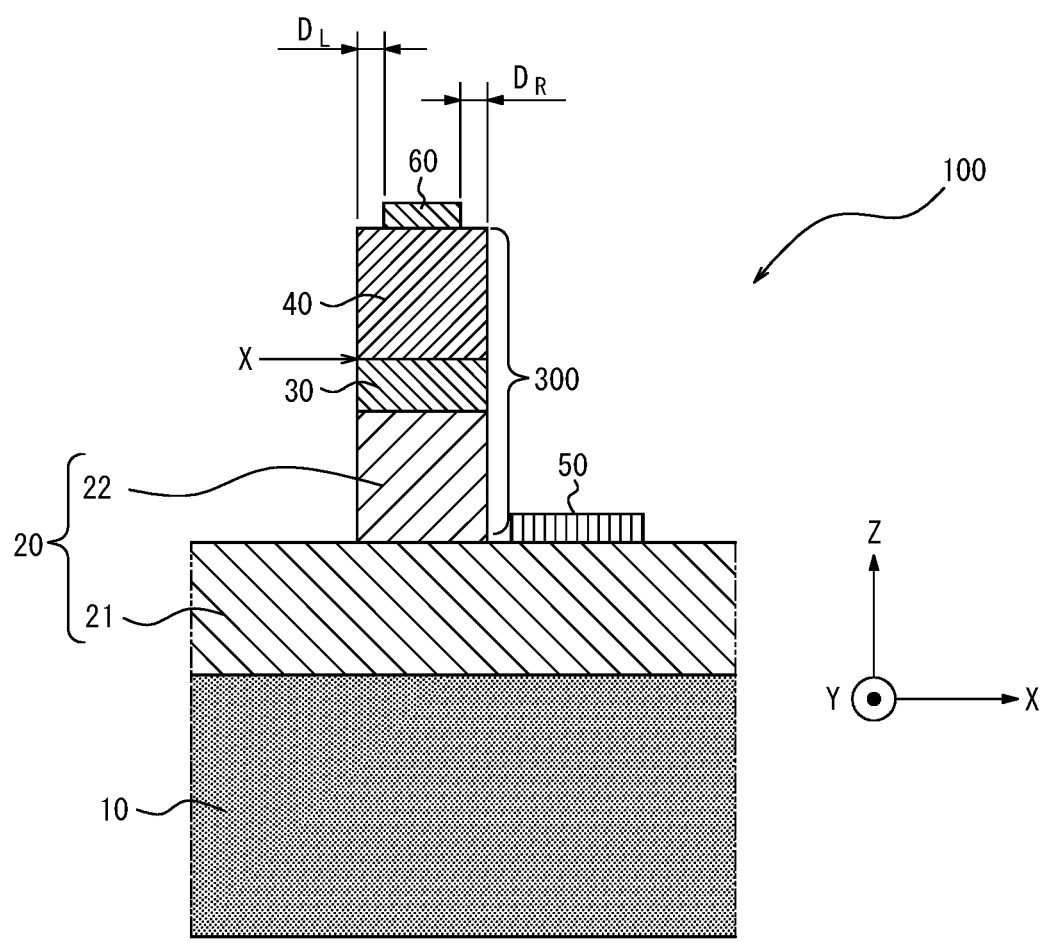
FIG. 3A is a side view illustrating the configuration of an ultraviolet laser diode according to the first embodiment.
Figure 3B:
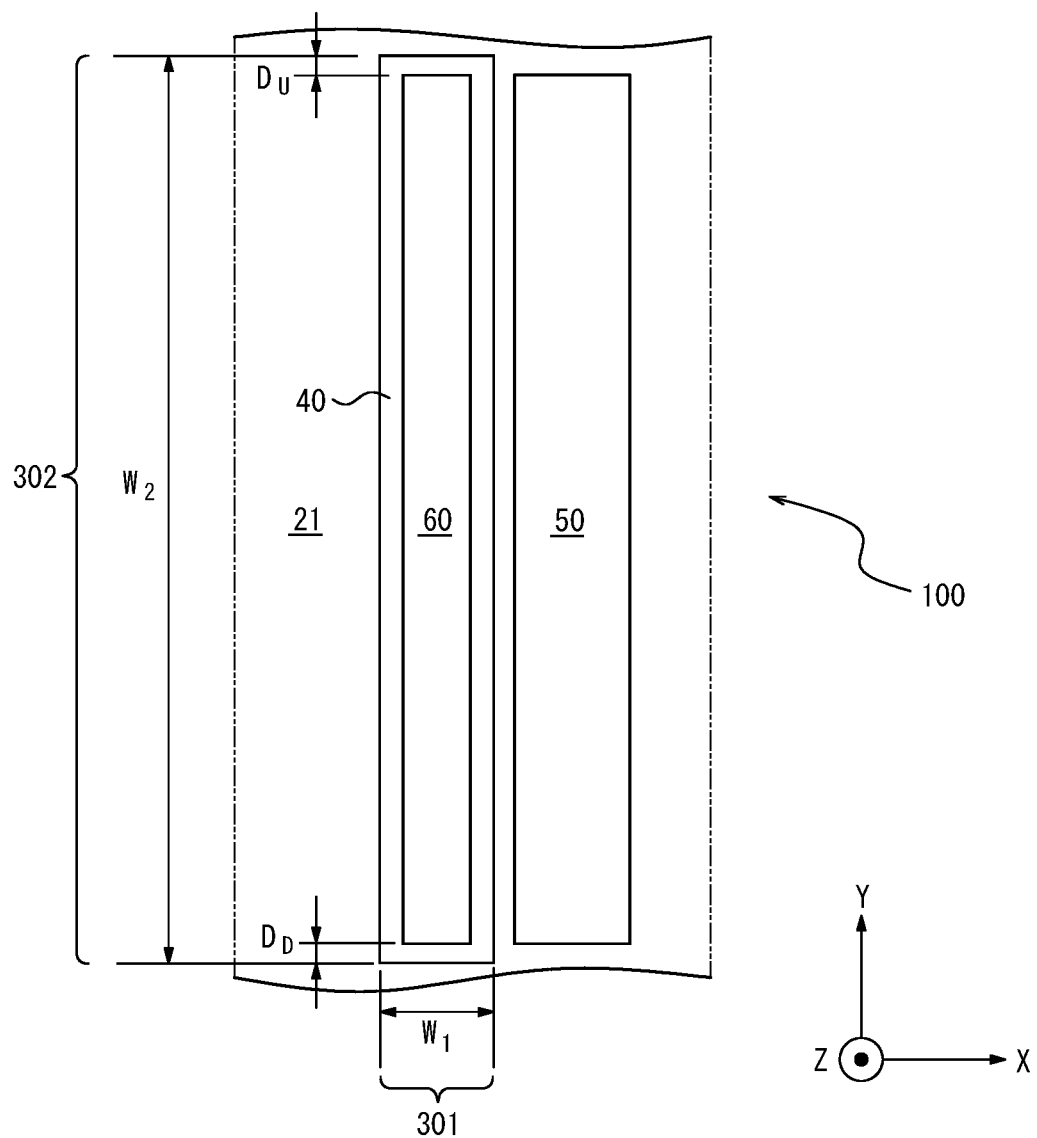
FIG. 3B is a plan view illustrating the configuration of an ultraviolet laser diode according to the first embodiment.

Example configurations of the ultraviolet laser diode 100 according to the first embodiment are described with reference to FIGS. 3A and 3B.

Details of each configuration are sequentially described below. The same constituent elements are labeled with the same reference signs, and the shape, thickness, and the like of each constituent element are as described above. A redundant explanation is omitted.

[Substrate]

The substrate 10 is not particularly limited, as long as the nitride semiconductor laminate 200 (see FIG. 2A) can be stacked thereon. Examples of the substrate 10 include an aluminum nitride single crystal substrate, a sapphire substrate, and a composite substrate in which a nitride aluminum film is formed on a sapphire substrate. In particular, the use of an aluminum nitride single crystal substrate as the substrate 10 enables formation of a high quality nitride semiconductor laminate 200.

[First Cladding Layer]

The first cladding layer 20 is provided on the substrate 10. The first cladding layer 20 includes the first area 21 of the first conductive nitride semiconductor layer and the second area 22 of the first conductive nitride semiconductor layer. The first area 21 and the second area 22 are preferably formed from the same material. The first area 21 and the second area 22 are, for example, preferably formed from $Al_{0.7}Ga_{0.3}N$.

The first cladding layer 20 may be doped with impurities. Examples of the impurities include Si, Ge, C, and O. One of these impurities may be selected, or a plurality of these impurities may be selected. The concentration of the impurities is not particularly restricted, but the concentration is preferably $1 \times 10^{17}$ cm$^{-3}$ or more and $1 \times 10^{20}$ cm$^{-3}$ or less, more preferably $5 \times 10^{18}$ cm$^{-3}$ or more and $5 \times 10^{19}$ cm$^{-3}$ or less.

[Light-Emitting Layer]

The light-emitting layer 30 is provided on the first cladding layer 20. The emission wavelength of the light-emitting layer 30 is preferably 210 nm or more and 360 nm or less.

The light-emitting layer 30 includes one or more quantum well layers.

The material of the quantum well layers may be appropriately selected based on the desired emission wavelength. In the case of obtaining an emission wavelength in the ultraviolet region, the material used in the quantum well layers may, for example, be $Al_xGa_{1-x}N$ (where $0 \leq x \leq 0.8$).

The light-emitting layer 30 has a structure such that the upper side, the lower side, or both the upper and lower sides of the quantum well layer is in close contact with a layer formed from a different material than the quantum well layer. Examples of such a layer include an $Al_xGa_{1-x}N$ (where $0.5 \leq x \leq 0.7$) layer that is 10 nm or more and 200 nm or less.

A portion of the light-emitting layer 30 may be doped with impurities. Examples of the impurities include Si and C. The light-emitting layer 30 may intentionally have a structure not doped with impurities.

[Second Cladding Layer]

The second cladding layer 40 is provided on the light-emitting layer 30. The second cladding layer 40 includes the second conductive nitride semiconductor layer. All or a portion of the second cladding layer 40 preferably does not contain second conductive impurities such as Mg, B, Be, Si, or Li. By the second cladding layer 40 not containing second conductive impurities, the oscillation threshold current density of the ultraviolet laser diode 100 can be reduced as compared to a conventional ultraviolet laser diode.

All or a portion of the second cladding layer 40 preferably includes a composition gradient layer. A composition gradient layer refers to a layer such that the composition of the mixed crystal forming the material of the layer continuously changes in a direction perpendicular to the upper surface of the substrate 10. The current injection efficiency in the ultraviolet laser diode 100 can be improved by the second cladding layer 40 including the composition gradient layer.

The composition gradient layer may, for example, be formed by an AlGaN layer, and the Al composition may continuously decrease from 1.0 in a direction away from the interface X between the light-emitting layer 30 and the second cladding layer 40. By including such a composition gradient layer, the second cladding layer 40 can trap light, suppress carrier injection to the light-emitting layer 30, and serve as a layer to block electrons. The effect of reducing the oscillation threshold current density of the ultraviolet laser diode 100 can thus be expected.

The mesa structure 300 is formed by the above-described second area 22, light-emitting layer 30, and second cladding layer 40. A portion of the side surfaces of the mesa structure 300 forms the resonator end faces 301 of the ultraviolet laser diode 100.

[First Electrode]

The first electrode 50 is provided in the first area 21. The first electrode 50 is preferably formed by first conductive material electrically connected to the first cladding layer 20. Examples of the first conductive material include alloys containing any of Mo, Nb, Zr, Ti, Al, W, Ni, Au, V, or In, and the like. In particular, the use of an alloy containing any of V, Ti, Al, Ni, or Au as the first conductive material can reduce the contact resistance.

[Second Electrode]

The second electrode 60 is provided on the second cladding layer 40. The second electrode 60 is preferably formed by second conductive material electrically connected to the second cladding layer 40. Examples of the second conductive material include any of Ti, Pt, Ni, Pd, Au, Pt, Co, Cu, Ni, Ta, or Ru, alloys containing any of these, and the like. In particular, the use of an alloy containing any of Ti, Pt, Ni, Au, or Pd as the second conductive material can reduce the contact resistance.

In the ultraviolet laser diode 100 according to the present embodiment, the second electrode 60 is disposed in an area that is on the second cladding layer 40 and is such that the distance $D_R$, $D_L$ from the side surfaces 302 of the mesa structure 300 is 5 μm or more. The oscillation threshold current density can thereby be reduced as compared to the conventional ultraviolet laser diodes 100A, 100B.

Second Embodiment

<Method of Producing Ultraviolet Laser Diode>

An example method of producing an ultraviolet laser diode 100X according to the second embodiment is described with reference to FIGS. 4A through 4E.

The method of producing the ultraviolet laser diode 100X according to the second embodiment differs from the method of producing the ultraviolet laser diode 100 according to the first embodiment in that the resonator end faces 301 and the side surfaces 302 of the mesa structure 300 are formed by etching in the method of producing the ultraviolet laser diode 100 according to the first embodiment, whereas the resonator end faces 301 are formed by cleavage, and the side surfaces 302 of a mesa structure 300X are formed by etching in the method of producing the ultraviolet laser diode 100X according to the second embodiment. Since the other procedures are similar, a redundant explanation is omitted.

[Formation Process of Nitride Semiconductor Laminate: Step S101]

Figure 4A:
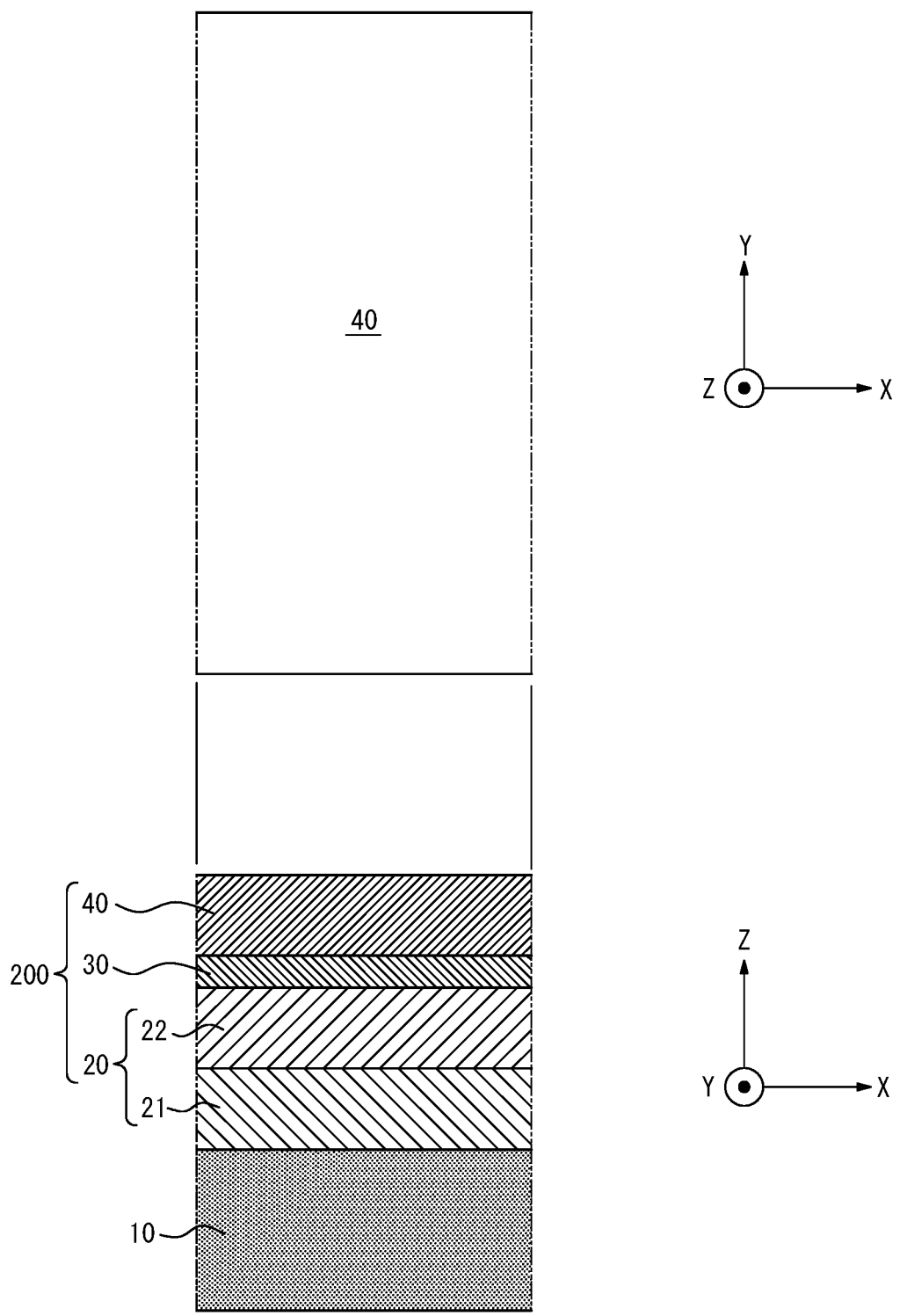
FIG. 4A is a diagram illustrating an example of a method of producing an ultraviolet laser diode according to a second embodiment.

First, as illustrated in FIG. 4A, the first cladding layer 20, the light-emitting layer 30, and the second cladding layer 40 are stacked in this order on the substrate 10 to form the nitride semiconductor laminate 200. The first cladding layer 20 includes the first area 21 of the first conductive nitride semiconductor layer and the second area 22 of the first conductive nitride semiconductor layer. The light-emitting layer 30 includes one or more quantum well layers. The second cladding layer 40 includes the second conductive nitride semiconductor layer.

[Formation Process of Mesa Structure: Step S102]

Figure 4B:
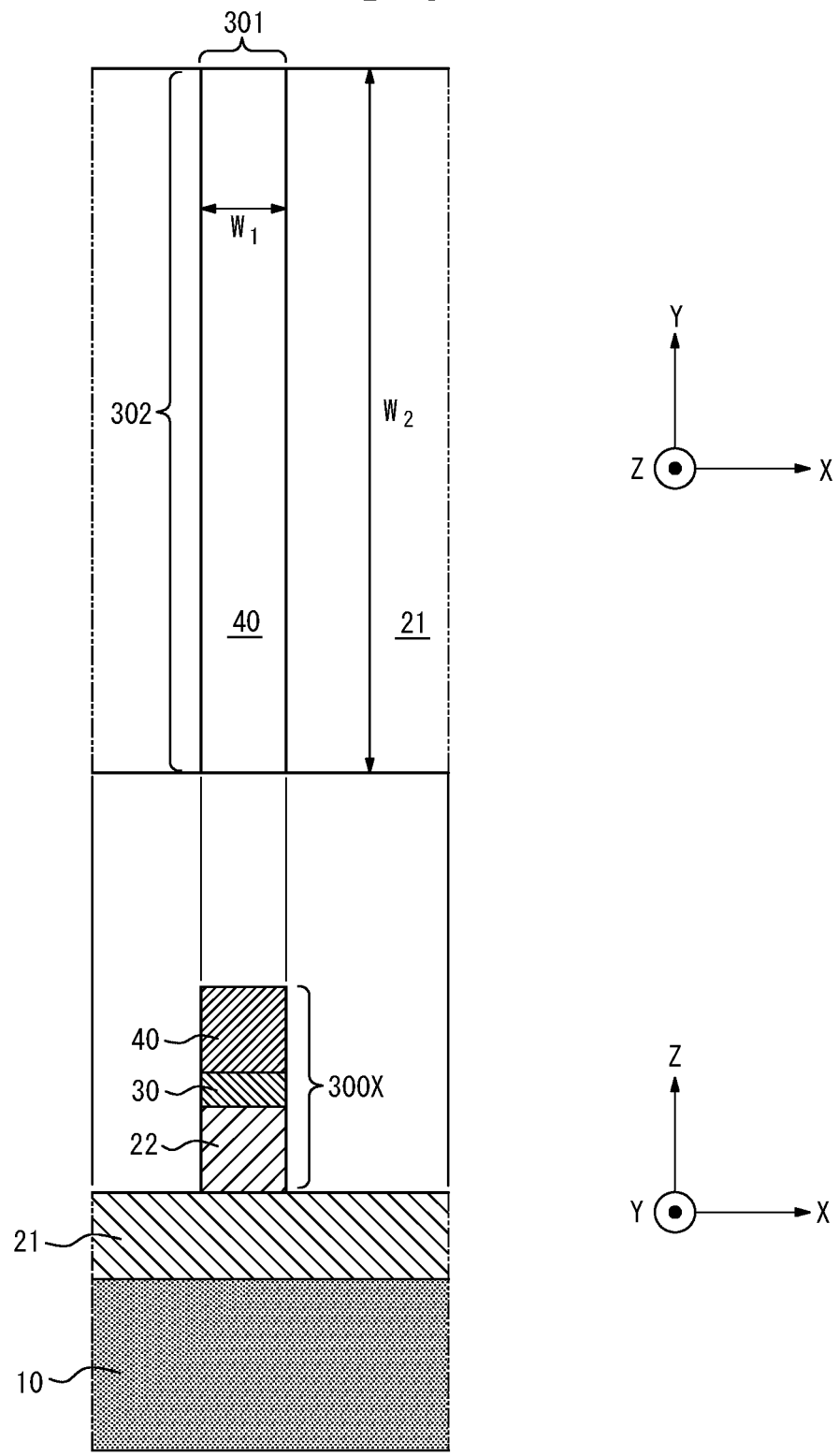
FIG. 4B is a diagram illustrating an example of the method of producing an ultraviolet laser diode according to the second embodiment.

Next, as illustrated in FIG. 4B, etching or cleavage is performed on at least a portion of the nitride semiconductor laminate 200 to form the mesa structure 300X that includes the second area 22, the light-emitting layer 30, and the second cladding layer 40.

In the mesa structure 300X, the length W1 of the resonator end faces 301 in plan view is preferably shorter than the length W2 of the side surfaces 302 of the mesa structure 300X in plan view. In the mesa structure 300X, the ratio between the length $W_1$ of the resonator end faces 301 and the length $W_2$ of the side surfaces 302 of the mesa structure 300 in plan view is preferably 1:5 or more and 1:500 or less. Setting the ratio between the length $W_1$ of the resonator end faces 301 and the length $W_2$ of the side surfaces 302 of the mesa structure 300X in plan view within this range enables efficient current injection over a wide area in the resonance direction in the ultraviolet laser diode 100X. Furthermore, a current constriction effect can reduce the drive current for reaching the oscillation threshold current density, thereby reducing the heat produced by resistance and endowing the ultraviolet laser diode 100X with longer element life.

The resonator end faces 301 are preferably formed by cleavage. Cleavage refers to the use of various appropriate processes to expose and cleave a natural cleavage surface of a wafer. Examples of cleavage include a process to form an altered layer by laser irradiation of the front surface or back surface of a wafer, along with a scribe process to scratch by physical contact, thus providing a trigger for formation of a cleavage surface, and a breaking process to apply stress to the wafer to widen and expose the cleavage surface starting at the provided trigger. When the resonator end faces 301 are formed by cleavage, the emission efficiency of the ultraviolet laser diode 100X can be improved.

The side surfaces 302 of the mesa structure 300X are preferably formed by etching. By at least the side surfaces 302 being formed by etching in the mesa structure 300X, the oscillation threshold current density of the ultraviolet laser diode 100X can be reduced as compared to a conventional ultraviolet laser diode.

With regards to the order in which processes are performed on the nitride semiconductor laminate 200, the etching process is preferably performed first, with the cleavage process being performed subsequently. The emission efficiency of the ultraviolet laser diode 100X can thus be improved.

[Formation Process of First Electrode: Step S103]

Figure 4C:
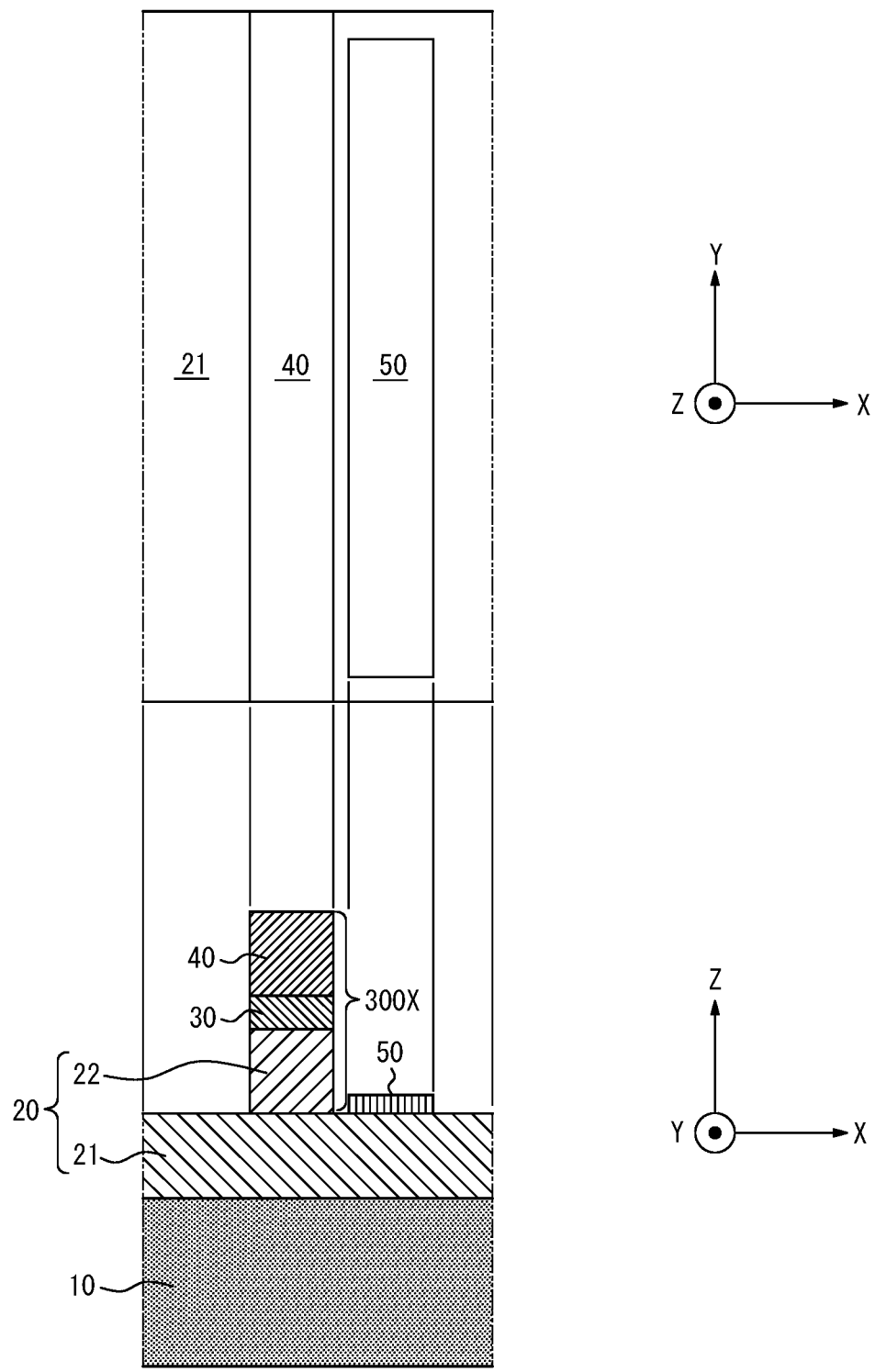
FIG. 4C is a diagram illustrating an example of the method of producing an ultraviolet laser diode according to the second embodiment.

Next, as illustrated in FIG. 4C, the first conductive material is disposed on a portion of the first area 21, and heat treatment of 400° C. or higher is applied to form a first electrode 50. By the temperature of the heat treatment being set to at least 400° C., the first electrode 50 can be alloyed, and the contact resistance can be reduced.

[Formation Process of Second Electrode: Step S104]

Figure 4D:
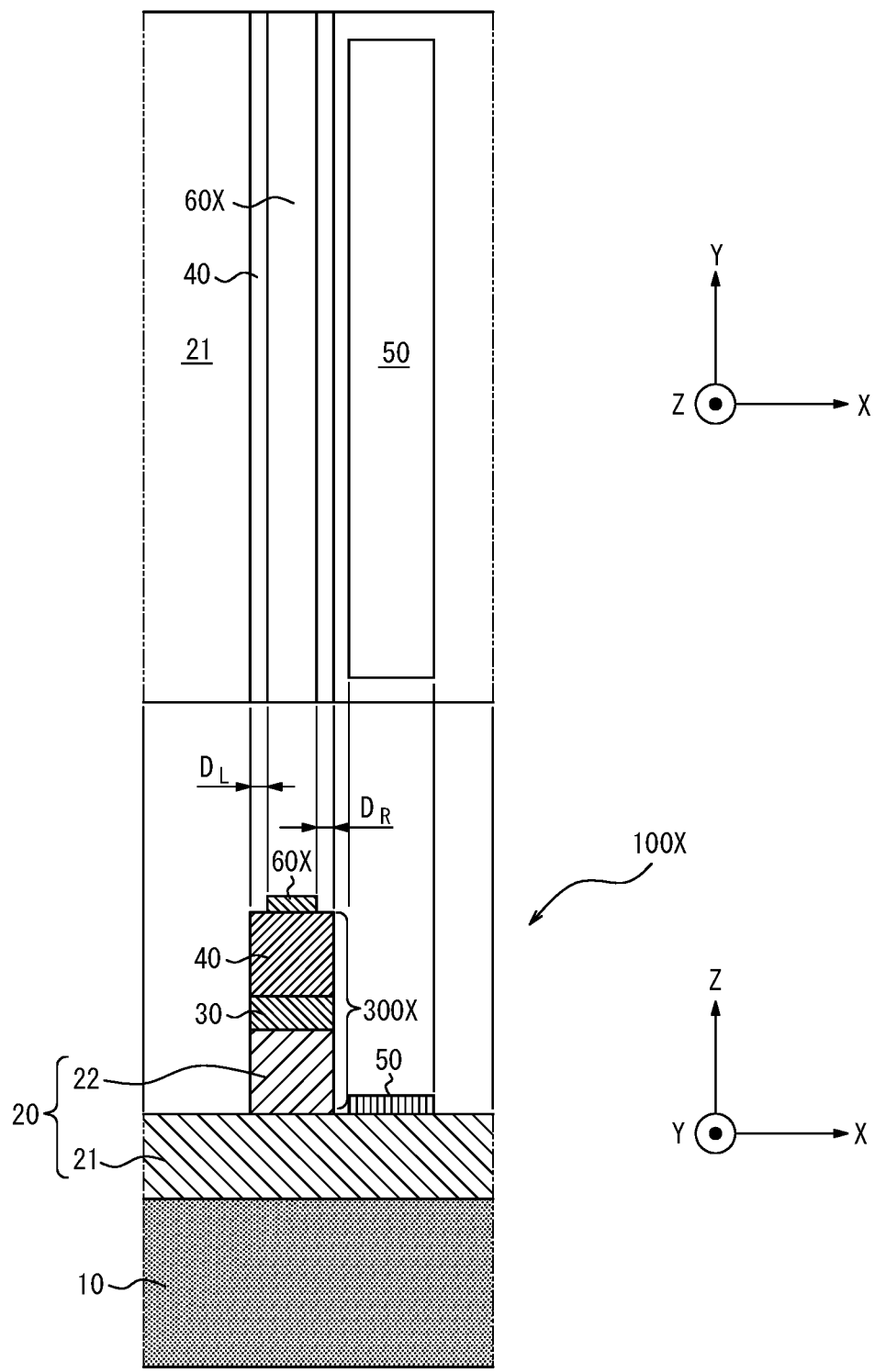
FIG. 4D is a diagram illustrating an example of the method of producing an ultraviolet laser diode according to the second embodiment.
Figure 4E:
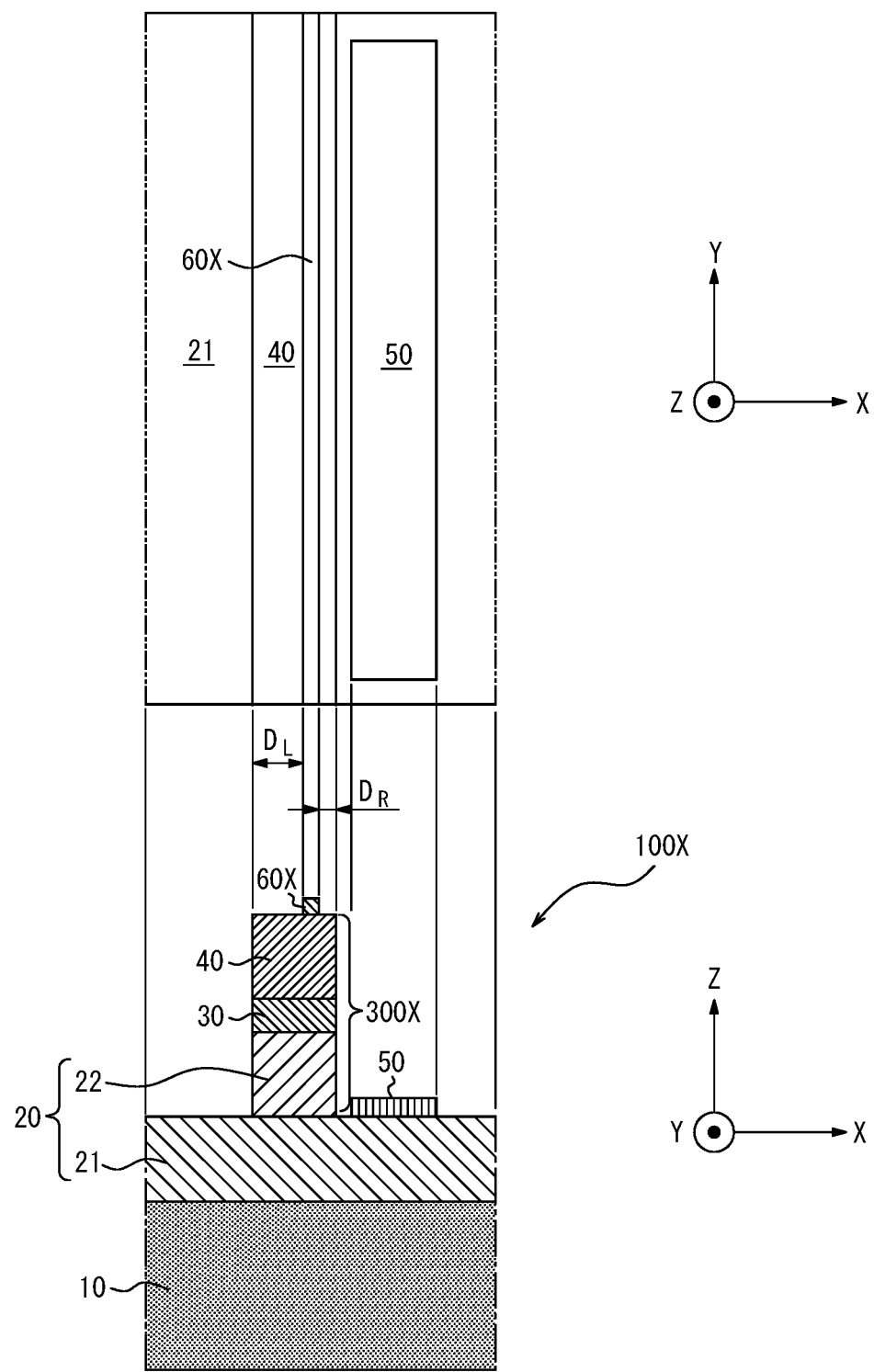
FIG. 4E is a diagram illustrating an example of the method of producing an ultraviolet laser diode according to the second embodiment.

Next, as illustrated in FIGS. 4D and 4E, the second conductive material is disposed in an area that is on the second cladding layer 40 and is such that the distance from the resonator end faces 301 is 5 μm or less, and the distance $D_R$, $D_L$ from the side surfaces 302 of the mesa structure 300X is 5 μm or more. The second electrode 60X is thereby formed.

The second conductive material may be disposed in the entire area that is on the second cladding layer 40 and is such that the distance from the resonator end faces 301 is 5 μm or less, and the distance $D_R$, $D_L$ from the side surfaces 302 of the mesa structure 300X is 5 μm or more, as illustrated in FIG. 4D. For example, the second conductive material may be disposed in the entire area that is on the second cladding layer 40 and is such that the distance from the resonator end faces 301 is 0 μm, and the distance $D_R$, $D_L$ between the second electrode 60X and the side surfaces 302 of the mesa structure 300X is 5 μm.

As illustrated in FIG. 4E, the second conductive material may be disposed in a partial area that is on the second cladding layer 40 and is such that the distance from the resonator end faces 301 is 5 μm or less, and the distance $D_R$, $D_L$ from the side surfaces 302 of the mesa structure 300X is 5 μm or more. For example, the second conductive material may be disposed in an area that is on the second cladding layer 40 and is such that the distance from the resonator end faces 301 is 0 μm, the distance $D_R$ from one side surface 302 of the mesa structure 300X is 5 μm, and the distance $D_L$ from the other side surface 302 of the mesa structure 300X is 15 μm.

Furthermore, the second conductive material may be disposed as dots or stripes in an area that is on the second cladding layer 40 and is such that the distance from the resonator end faces 301 is 5 μm or less, and the distance $D_R$, $D_L$ from the side surfaces 302 of the mesa structure 300X is 5 μm or more.

The oscillation threshold current density in the ultraviolet laser diode 100X can be reduced when the second conductive material is disposed in the area where the distance from the resonator end faces 301 is 5 μm or less.

By the second conductive material being disposed in an area such that the distance $D_R$, $D_L$ from the side surfaces 302 of the mesa structure 300X is 5 μm or more and not being disposed in an area such that the distance $D_R$, $D_L$ from the side surfaces 302 of the mesa structure 300X is less than 5 μm, the oscillation threshold current density of the ultraviolet laser diode 100X can be reduced as compared to a conventional ultraviolet laser diode.

In particular, by the second conductive material being disposed in an area such that the distance $D_R$, $D_L$ from the side surfaces 302 of the mesa structure 300X is 15 μm or more and not being disposed in an area such that the distance $D_R$, $D_L$ from the side surfaces 302 of the mesa structure 300X is less than 15 μm, the effect of reducing the oscillation threshold current density of the ultraviolet laser diode 100X as compared to a conventional ultraviolet laser diode can be stably achieved.

The ultraviolet laser diode 100X according to the present embodiment can be produced by performing all, or an appropriately selected portion, of the aforementioned processes. In the ultraviolet laser diode 100X according to the present embodiment, the second electrode 60X is disposed in an area that is on the second cladding layer 40 and is such that the distance from the resonator end faces 301 is 5 μm or less, and the distance $D_R$, $D_L$ from the side surfaces 302 of the mesa structure 300X is 5 μm or more. The oscillation threshold current density can thereby be reduced as compared to the conventional ultraviolet laser diodes 100A, 100B.

EXAMPLES

<Comparison of Oscillation Threshold Current Density>

The oscillation threshold current density was measured for an ultraviolet laser diode according to the present embodiment and a conventional ultraviolet laser diode, and the measurement results were compared.

Example 1

Figure 5:
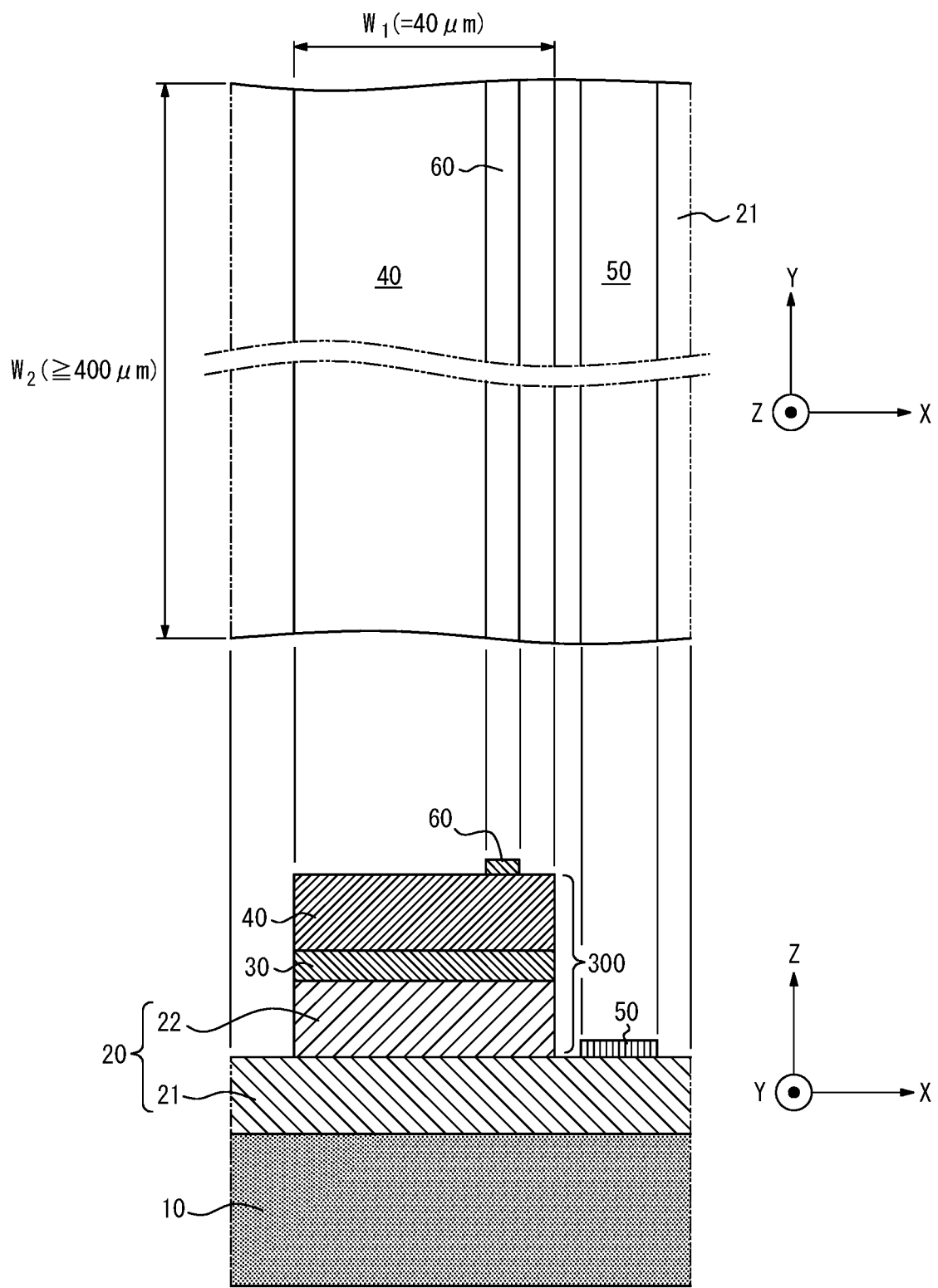
FIG. 5 is a schematic diagram illustrating an example of the configuration of an ultraviolet laser diode used in the Examples.

As Example 1, a first conductive nitride semiconductor layer (first cladding layer) made of $Al_{0.7}Ga_{0.3}N$ doped with $1×10^{19}$ cm$^{-3}$ of Si, a 9 nm light-emitting layer sandwiched between layers of made of $Al_{0.63}Ga_{0.37}N$, a second conductive nitride semiconductor layer (second cladding layer) intentionally not doped with impurities throughout and having an Al composition that continuously decreases from 1.0 to 0.7 towards the AlN substrate upper surface, and a contact layer made of a layer having an Al composition that continuously decreases from 0.7 to 0.3 towards the AlN substrate upper surface and a GaN layer were deposited on the upper surface of an AlN substrate in this order to form a nitride semiconductor laminate. A portion of the first cladding layer was then exposed by etching to form a rectangular mesa structure with a length $W_1$ of 40 μm in a direction perpendicular to the normal direction of the resonator end faces, i.e., the <11-20> direction, and a length $W_2$ of 400 μm or more in the normal direction of the resonator end faces, i.e., the <1-100> direction. Next, a first electrode containing Au, Al, Ni, and V was formed in a first area of the exposed first conductive nitride semiconductor layer. The first electrode was subjected to heat treatment at 800° C. or higher. Furthermore, a second conductive material containing Au and Ni was disposed across the entire area (width 5 μm) from 5 μm or more to 10 μm or less from one side surface of the mesa structure and subjected to heat treatment at 450° C. or higher to form a second electrode (see FIG. 5). The mesa structure was then cut into a length of 400 μm by cleavage to produce an ultraviolet laser diode containing a resonator with two resonator end faces, i.e., a resonator having a mesa structure with a ratio of 1:10 between the length of the resonator end faces and the length of the side surfaces of the mesa structure in plan view. Measurement of the oscillation threshold current density of the ultraviolet laser diode according to Example 1 yielded laser oscillation at a threshold current density of 16 kA/cm$^2$ (see Table 1).

Example 2

As Example 2, a second conductive material containing Au and Ni was disposed across the entire area (width 5 μm) from 10 μm or more to 15 μm or less from one side surface of the mesa structure and subjected to heat treatment at 450° C. or higher to form a second electrode. Other than the difference in position for forming the second electrode, an ultraviolet laser diode was produced in a similar way to Example 1. Measurement of the oscillation threshold current density of the ultraviolet laser diode according to Example 2 yielded laser oscillation at a threshold current density of 14 kA/cm$^2$ (see Table 1).

Example 3

As Example 3, a second conductive material containing Au and Ni was disposed across the entire area (width 5 μm) from 15 μm or more to 20 μm or less from one side surface of the mesa structure and subjected to heat treatment at 450° C. or higher to form a second electrode. Other than the difference in position for forming the second electrode, an ultraviolet laser diode was produced in a similar way to Example 1. Measurement of the oscillation threshold current density of the ultraviolet laser diode according to Example 3 yielded laser oscillation at a threshold current density of 12 kA/cm$^2$ (see Table 1).

Comparative Example 1

As Comparative Example 1, a second conductive material containing Au and Ni was disposed across the entire area (width 5 μm) from 3 μm or more to 8 μm or less from one side surface of the mesa structure and subjected to heat treatment at 450° C. or higher to form a second electrode. Other than the difference in position for forming the second electrode, an ultraviolet laser diode was produced in a similar way to Example 1. Measurement of the oscillation threshold current density of the ultraviolet laser diode according to Comparative Example 1 yielded laser oscillation at a threshold current density of 40 kA/cm² (see Table 1).

Example 4

As Example 4, the second cladding layer was intentionally not doped with impurities in an area at a depth from 0% to less than 15.5% of the thickness from the side of the second cladding layer closer to the substrate upper surface but was intentionally doped with Mg at a concentration of 1×10¹⁹ cm⁻³ in a range from 15.5% to 100% of the thickness from the side of the second cladding layer closer to the substrate upper surface. Apart from this difference, an ultraviolet laser diode was produced in a similar way to Example 1. Measurement of the oscillation threshold current density of the ultraviolet laser diode according to Example 4 yielded laser oscillation at a threshold current density of 17 kA/cm² (see Table 1).

Example 5

As Example 5, a second conductive material containing Au and Ni was disposed across the entire area (width 5 μm) from 10 μm or more to 15 μm or less from one side surface of the mesa structure and subjected to heat treatment at 450° C. or higher to form a second electrode. Other than the difference in position for forming the second electrode, an ultraviolet laser diode was produced in a similar way to Example 4. Measurement of the oscillation threshold current density of the ultraviolet laser diode according to Example 5 yielded laser oscillation at a threshold current density of 16 kA/cm² (see Table 1).

Example 6

As Example 6, a second conductive material containing Au and Ni was disposed across the entire area (width 5 μm) from 15 μm or more to 20 μm or less from one side surface of the mesa structure and subjected to heat treatment at 450° C. or higher to form a second electrode. Other than the difference in position for forming the second electrode, an ultraviolet laser diode was produced in a similar way to Example 4. Measurement of the oscillation threshold current density of the ultraviolet laser diode according to Example 6 yielded laser oscillation at a threshold current density of 13 kA/cm² (see Table 1).

Comparative Example 2

As Comparative Example 2, a second conductive material containing Au and Ni was disposed across the entire area (width 5 μm) from 3 μm or more to 8 μm or less from one side surface of the mesa structure and subjected to heat treatment at 450° C. or higher to form a second electrode. Other than the difference in position for forming the second electrode, an ultraviolet laser diode was produced in a similar way to Example 4. Measurement of the oscillation threshold current density of the ultraviolet laser diode according to Comparative Example 2 yielded laser oscillation at a threshold current density of 41 kA/cm² (see Table 1).

[Measurement Results]

Table 1 summarizes the results of measuring the oscillation threshold current density of the ultraviolet laser diodes according to Examples 1 to 6, Comparative Example 1, and Comparative Example 2.

TABLE 1

| | Impurity doping of second cladding layer | Minimum distance from side surface of mesa structure formed by etching to area where second electrode is disposed | Width of second electrode | Oscillation threshold current density |
|---|---|---|---|---|
| Example 1 | entirely undoped | 5 μm | 5 μm | 16 kA/cm² |
| Example 2 | | 10 μm | | 14 kA/cm² |
| Example 3 | | 15 μm | | 12 kA/cm² |
| Comparative Example 1 | | 3 μm | | 40 kA/cm² |
| Example 4 | partially doped | 5 μm | | 17 kA/cm² |
| Example 5 | | 10 μm | | 16 kA/cm² |
| Example 6 | | 15 μm | | 13 kA/cm² |
| Comparative Example 2 | | 3 μm | | 41 kA/cm² |

From Table 1, it is clear that the ultraviolet laser diodes according to Examples 1 to 6 undergo laser oscillation at a significantly lower oscillation threshold current density than the ultraviolet laser diodes according to Comparative Examples 1 and 2.

In other words, an ultraviolet laser diode that includes the second electrode in an area that is on the second cladding layer and is at a distance of 5 μm or more from the side surface of a mesa structure formed by etching (for example, an area at a distance of 5 μm or more and 10 μm or less, a distance of 10 μm or more and 15 μm or less, or a distance of 15 μm or more and 20 μm or less) and does not include the second electrode in an area at a distance of less than 5 μm undergoes laser oscillation at a significantly lower oscillation threshold current density than an ultraviolet laser diode that includes the second electrode in an area at a distance of less than 5 μm from the side surface of a mesa structure formed by etching (for example, an area at a distance of 3 μm or more and 8 μm or less).

This suggests that the ultraviolet laser diode according to the present embodiment can undergo laser oscillation at a significantly lower oscillation threshold current density than a conventional ultraviolet laser diode.

From Table 1, it is also clear that the ultraviolet laser diodes according to Examples 1 to 3 undergo laser oscillation at a lower oscillation threshold current density overall than the ultraviolet laser diodes according to Examples 4 to 6.

This suggests that an ultraviolet laser diode in which the entire second cladding layer does not include the second conductive impurity can undergo laser oscillation at a lower oscillation threshold current density than an ultraviolet laser diode in which a portion of the second cladding layer is doped with the second conductive impurity.

<Modification>

In the present embodiment, stating that the nitride semiconductor laminate is formed by stacking layers "in this order" means that as long as the layers (such as the first cladding layer, light emitting layer, and second cladding layer) are stacked in this order, no restrictions are placed on other layers, which may be included between these layers and/or above or below these layers.

The method of producing an ultraviolet laser diode according to the present embodiment may further include forming an insulation layer, after formation of the mesa structure 300, in an area that is on the second cladding layer 40 and is at least an area at a distance of less than 5 μm from the side surface of the mesa structure 300. In this way, leak current between the first conductive material and the second conductive material can be suppressed when the ultraviolet laser diode 100, 100X is driven by current.

<Other Modifications>

The present disclosure is not limited to the above Examples and Modification. For example, the various processes described above are not limited to being performed in chronological order and may be performed in parallel or individually, as needed or in accordance with the processing capability of the apparatus performing the process. Other changes can be made as appropriate without departing from the spirit and scope of the present disclosure.

The above embodiments have been described as representative examples, but it will be apparent to one of ordinary skill in the art that numerous modifications and substitutions may be made within the spirit and scope of the present disclosure. Therefore, the present disclosure should not be interpreted as being restricted to the above embodiments. A variety of changes or modifications may be made without departing from the scope of the appended claims. For example, a plurality of steps listed in the flowchart of the embodiments may be combined into one, or a single step may be divided into a plurality of steps.

The invention claimed is:

1. An ultraviolet laser diode comprising:
   a first cladding layer that includes a first area of a first conductive nitride semiconductor layer and a second area of the first conductive nitride semiconductor layer, a light-emitting layer that includes one or more quantum well layers, and a second cladding layer that includes a second conductive nitride semiconductor layer on a substrate in this order; and
   an electrode provided on the second cladding layer, wherein
   in a mesa structure that includes the second area, the light-emitting layer, the second cladding layer, a width of resonator end faces, which are of equal width W, and a length of side surfaces of the mesa structure, which are of equal length L, in plan view, a ratio W:L is 1:5 or more and 1:500 or less,
   the width W 40 μm or less, and
   the electrode is distanced from each of the side surfaces of the mesa structure by more than 5 μm in the plan view.

2. The ultraviolet laser diode of claim 1, wherein all or a portion of the second cladding layer does not include a conductive impurity.

3. The ultraviolet laser diode of claim 1, wherein all or a portion of the second cladding layer includes a composition gradient layer.

4. The ultraviolet laser diode of claim 1, wherein the substrate is an aluminum nitride single crystal substrate.

5. The ultraviolet laser diode of claim 1, wherein an emission wavelength of the light-emitting layer is 210 nm or more and 360 nm or less.

6. The ultraviolet laser diode of claim 1, wherein a shape of the mesa structure is cuboid.

7. The ultraviolet laser diode of claim 1, wherein the resonator end faces include the light-emitting layer.

8. The ultraviolet laser diode of claim 1, wherein the mesa structure includes the light-emitting layer.

9. The ultraviolet laser diode of claim 1, wherein the electrode is distanced from the resonator end faces by 5 μm or more in the plan view.

* * * * *